United States Patent [19]

Slatter et al.

[11] Patent Number: 5,089,431
[45] Date of Patent: Feb. 18, 1992

[54] METHOD OF MANUFACTURING A SEMICONDUCTOR DEVICE INCLUDING A STATIC INDUCTION TRANSISTOR

[75] Inventors: John A. G. Slatter, Crawley Down; Henry E. Brockman, Horley, both of England; Jan Haisma, Valkenswaard, Netherlands

[73] Assignee: U.S. Philips Corporation, New York, N.Y.

[21] Appl. No.: 585,340

[22] Filed: Sep. 19, 1990

[30] Foreign Application Priority Data

Oct. 23, 1989 [GB] United Kingdom ............... 8923806

[51] Int. Cl.⁵ .......................................... H01L 21/283
[52] U.S. Cl. ....................................... 437/39; 437/475; 437/203; 437/911; 437/178; 437/179; 148/DIG. 12
[58] Field of Search ............... 357/23.1, 55; 437/39, 437/175, 176, 777, 178, 779, 203, 911; 148/DIG. 12

[56] References Cited

U.S. PATENT DOCUMENTS

| 4,181,542 | 1/1980 | Yoshida et al. ............ 437/911 |
| 4,451,843 | 5/1984 | Dahlberg ..................... 357/36 |
| 4,468,683 | 8/1984 | Dahlberg ................... 357/23.1 |
| 4,638,552 | 1/1987 | Shimbo et al. ........ 148/DIG. 12 |
| 4,674,174 | 6/1987 | Kishita et al. ............... 437/179 |

FOREIGN PATENT DOCUMENTS 0190508 8/1986 European Pat. Off. .
0211353 2/1987 European Pat. Off. .
1536545 12/1978 United Kingdom .

OTHER PUBLICATIONS

European Search Report, EP 90 20 2803.

Primary Examiner—Brian E. Hearn
Assistant Examiner—T. N. Quach
Attorney, Agent, or Firm—Paul R. Miller

[57] ABSTRACT

A semiconductor device (10) is formed by providing first and second semiconductor bodies (1 and 11) each having first and second major surfaces (2 and 3) and (12 and 13), respectively, defining a rectifying junction pattern (21) adjacent to at least one (12) of the first major surfaces, and bonding the first major surfaces (2 and 12) together to join the two semiconductor bodies (1 and 11) to form the semiconductor device (10) in which the rectifying junction pattern 21 defines a path for the flow of charge carriers between the second major surfaces. The rectifying junction pattern (21) is defined at the one first major surface (12) by an electrically conductive pattern (20) forming a Schottky junction (21) with at least one of the first and second semiconductor bodies (1 and 11).

5 Claims, 4 Drawing Sheets phis
METHOD OF MANUFACTURING A SEMICONDUCTOR DEVICE INCLUDING A STATIC INDUCTION TRANSISTOR This invention relates to a method of manufacturing a semiconductor device such as, for example, a static induction transistor (SIT).

BACKGROUND OF THE INVENTION

European Patent Application EP-A-190508 describes a method of manufacturing a static induction transistor, which method comprises providing first and second semiconductor bodies each having first and second major surfaces, defining a rectifying junction pattern adjacent to at least one of the first major surfaces, and bonding the first major surfaces together to join the two semiconductor bodies to form the semiconductor device in which the rectifying junction pattern defines a path for the flow of charge carriers between the second major surfaces.

As described with reference to FIGS. 4A to 4F of EP-A-190508, the two first major surfaces are bonded by a process known as 'slice-bonding' or 'slice-wringing' in which the first major surfaces are polished so as to be optically flat with a surface roughness of less than 50 nm (nanometers) and preferably less than 5 nm, this process being known as 'mirror-polishing'. The mirror-polished first major surfaces are brought into contact to establish bonding between the first major surfaces, and the joined bodies then subjected to a heat treatment to strengthen the bond.

Prior to bringing the first major surfaces into contact, the rectifying junction pattern is defined by introducing ions of the opposite conductivity type to the first and second semiconductor bodies into the one first major surface through an appropriate mask to define a layer pattern of the opposite conductivity type which, after bonding of the first and second semiconductor bodies, forms a pn junction with the first and second semiconductor bodies which defines the path for the flow of charge carriers between the second major surfaces and provides a buried gate layer of the static induction transistor. Electrical contact is made to the buried gate layer to enable a bias voltage to be applied to control the charge carrier path by etching a groove through one of the first and second semiconductor bodies to define a mesa structure exposing part of the gate transistor. Electrical contacts are also provided on the two second major surfaces to complete the device.

SUMMARY OF THE INVENTION

It is an aim of the present invention to provide a method of manufacturing a static induction transistor (SIT) in which a rectifying junction is formed at the one first major surface which can be easily contacted and may provide a relatively low resistance path.

According to one aspect of the present invention there is provided a method of manufacturing a semiconductor device, which method comprises providing first and second semiconductor bodies each having first and second major surfaces, defining a rectifying junction pattern adjacent to at least one of the first major surfaces, and bonding the first major surfaces together to join the two semiconductor bodies to form the semiconductor device in which the rectifying junction pattern defines a path for the flow of charge carriers between the second major surfaces, characterised by defining the rectifying junction pattern by defining at the one first major surface an electrically conductive pattern forming a Schottky junction with at least one of the first and second semiconductor bodies.

In another aspect, the present invention provides a semiconductor device comprising first and second semiconductor bodies each having first and second major surfaces with a rectifying junction pattern being defined adjacent to at least one of the first major surfaces and the first major surfaces being joined to form the semiconductor device in which the rectifying junction pattern defines a path for the flow of charge carriers between the second major surfaces, characterised in that the rectifying junction pattern is provided by an electrically conductive pattern defined on the one first major surface and forming a Schottky junction with at least one of the first and second semiconductor bodies.

A method in accordance with the invention enables a buried rectifying junction pattern to be formed which can be contacted easily and may provide a relatively low resistance path. Moreover, higher electric fields may exist above Schottky junctions than above pn junctions which should enable higher breakdown voltages to be achieved.

The electrically conductive pattern may be defined by forming one or more grooves in the one first major surface and providing electrically conductive material in the groove(s).

The electrically conductive pattern may be formed as an electrically conductive grid to which electrical contact may be made with the apertures of the grid thus providing the path for the flow of charge carriers between the second major surfaces. For example, the first and second semiconductor bodies may be of one conductivity type and electrical contact provided to the electrically conductive pattern by forming a highly doped region of the opposite conductivity type extending through one of the first and second semiconductor bodies to form an ohmic contact with the electrically conductive pattern.

The semiconductor device may be, for example, a static induction transistor and the first and second semiconductor bodies may each comprise a relatively highly doped layer adjacent the second major surface to which electrical contact is made and a relatively lowly doped layer of the same conductivity type adjacent the first major surface.

The first major surfaces may be bonded by mirror polishing the first major surfaces to form optically-flat activated surfaces, bringing the polished surfaces into contact to establish bonding between the first major surfaces and subjecting the joined bodies to a heat treatment to strengthen the bond between the first major surfaces.

The electrically conductive pattern may be formed by a material selected from a metallic conducting silicide such as molybdenum silicide, tungsten silicide or titanium silicide or a metallic conducting nitride such as tungsten nitride or hafnium nitride.

BRIEF DESCRIPTION OF THE DRAWINGS

Embodiments of the invention will now be described, by way of example, with reference to the accompanying drawings, in which.

Figure 1:
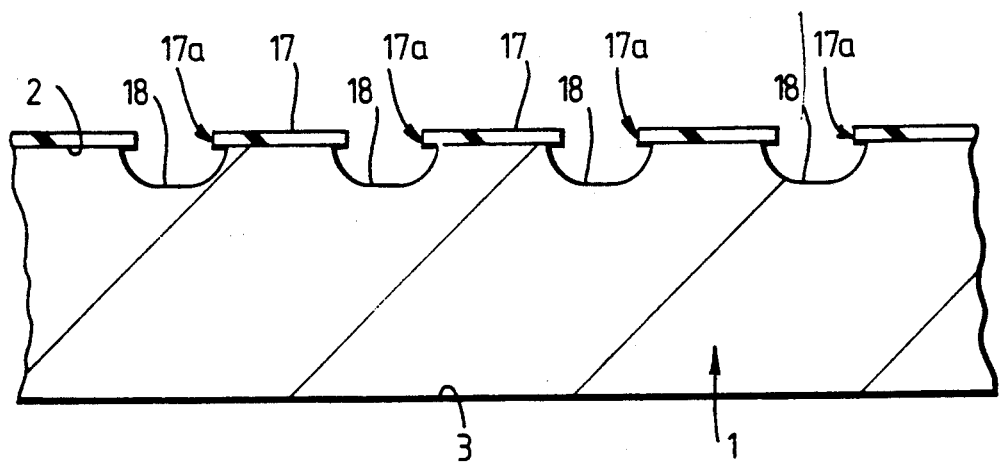
FIGS. 1, 2 and 3 are cross-sectional views of part of a first semiconductor body illustrating various steps in a method in accordance with the invention for manufacturing the semiconductor device.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

DESCRIPTION OF THE INVENTION

Referring now to the drawings, there is illustrated a method of manufacturing a semiconductor device 10 (See FIG. 8), which method comprises providing first and second semiconductor bodies 1 and 11 each having first and second major surfaces 2 and 3 and 12 and 13, respectively, defining a rectifying junction pattern 21 adjacent to at least one 12 of the first major surfaces, and bonding the first major surfaces 2 and 12 together to join the two semiconductor bodies 1 and 11 to form the semiconductor device 10 in which the rectifying junction pattern 21 defines a path for the flow of charge carriers between the second major surfaces.

In accordance with the invention, the method comprises defining the rectifying junction pattern 21 by defining at the one first major surface 12 and electrically conductive pattern 20 forming a Schottky junction 21 with at least one of the first and second semiconductor bodies 1 and 11. A buried rectifying junction pattern may thus be formed which can provide a relatively low resistance path and which allows relatively high fields, as compared with a pn junction pattern, to exist above the rectifying junction which should enable higher breakdown voltages to be achieved.

A method in accordance with the invention thus enables a rectifying junction to be buried within the semiconductor device in a relatively simple manner without having to rely on the diffusion properties of introduced dopants.

FIGS. 1 to 3 and 5 to 8 are cross-sectional views illustrating in detail one example of a method in accordance with the inveniton for manufacturing a static induction transistor (SIT).

FIG. 1 shows the first semiconductor body 1 which, in this example, comprises a monocrystalline silicon body 1 of one conductivity type, n conductivity type in this example. The silicon body 1 is relatively lowly doped and, typically, may have a resistivity of about 40 ohm-cm and a thickness of about 60 μm micrometers.

As shown in FIG. 1 a masking layer 17 is provided on the one first major surface 2 of the first semiconductor body 1. The masking layer 17 has windows 17a through which the monocrystalline silicon body 1 is etched using an appropriate known etching technique to define a pattern of grooves 18 at the one first major surface 2. In this example, a conventional isotropic etching technique may be used to define round-bottomed grooves 18.

Figure 2:
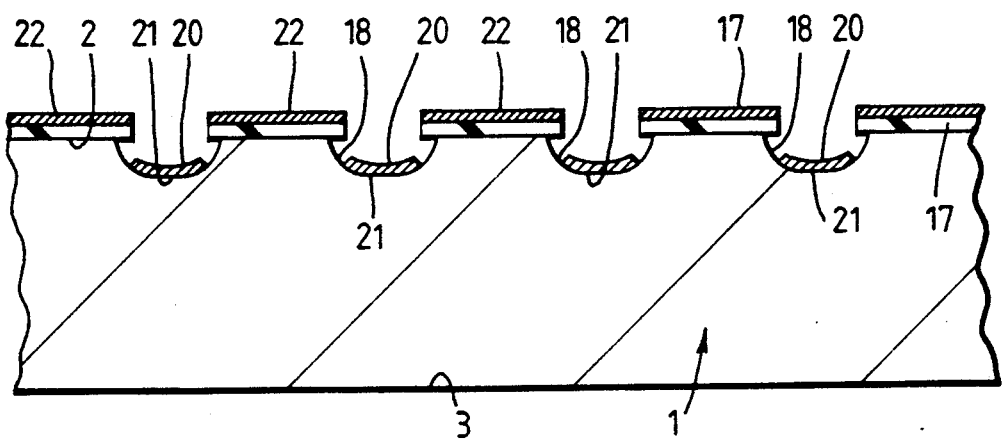
Figure 3:
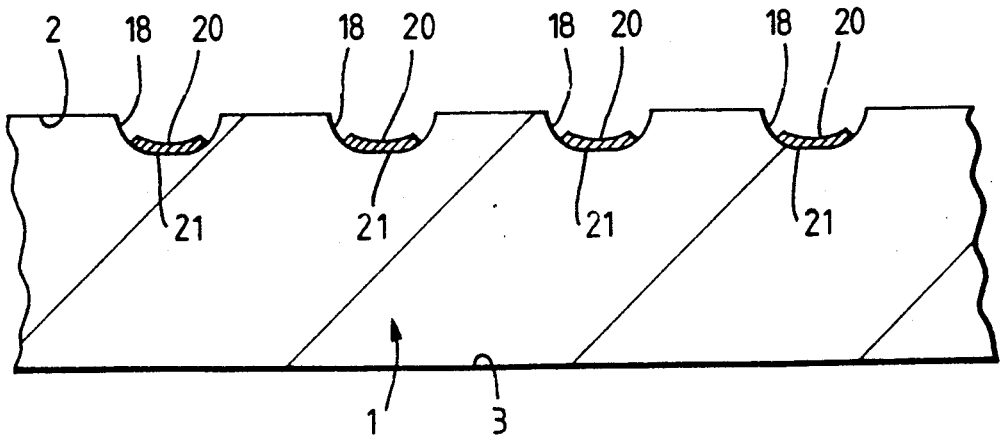

Electrically conductive material for defining the electrically conductive pattern 20 and forming the Schottky junction 21 is then deposited onto the masking layer 17 and into the grooves 18 as shown in FIG. 2. The masking layer 17 is then removed using conventional techniques thereby lifting off the portions 22 of the electrically conductive material deposited on the masking layer 17 to leave the electrically conductive pattern 20 in the grooves 18 to form the Schottky junction 21. This method thus enables the deposition of the electrically conductive material to be self-aligned with the grooves 18 because the same masking layer 17 is used in both cases.

Any electrically conductive material suitable for forming the Schottky junction 21 and capable of withstanding subsequent processing (to be described below) may be used. In this example the electrically conductive material may be a metallic conducting silicide such as molybdenum silicide, tungsten silicide or titanium silicide or a metallic conducting nitride such as tungsten nitride or hafnium nitride deposited by any suitable conventional technique for example rf (radio-frequency) evaporation, molecular beam epitaxy or sputtering to a thickness of about 0.2 μm.

Figure 4:
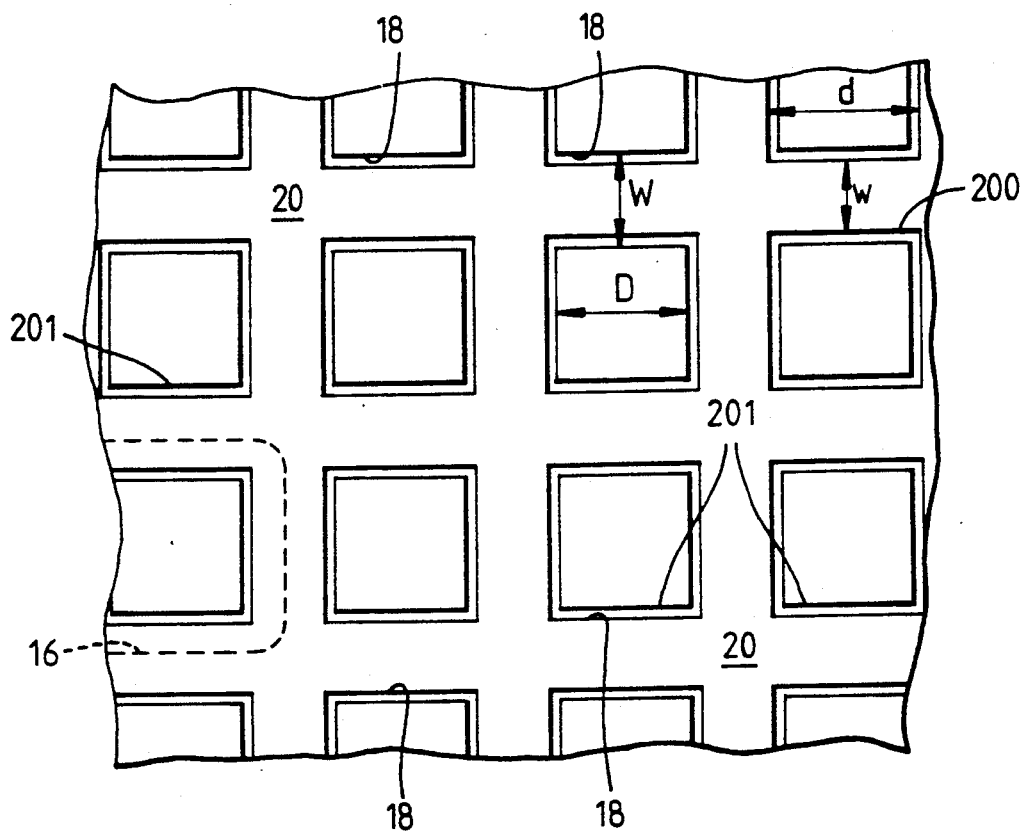
FIG. 4 is a plan view, looking in the direction of the arrow A in FIG. 3, of a portion of the first semiconductor body.

The geometry of the grooves 18 and thus of the electrically conductive pattern 20 may be selected as desired. In this example the masking layer 17 defines a window 17a in the form of a regular grid, for example a square or rectangular grid. FIG. 4 is a plan view looking in the direction of the arrow A in FIG. 3 to illustrate the rectangular grid, as shown a square grid, formed by the grooves 18 and the electrically conductive pattern 20. The apertures 201 provides by the grid will define, in the completed device, the path for the flow of charge carriers between the second major surfaces 3 and 13. Other geometries may be adopted, for example a honeycomb-like or hexagonal grid could be provided.

Figure 5:
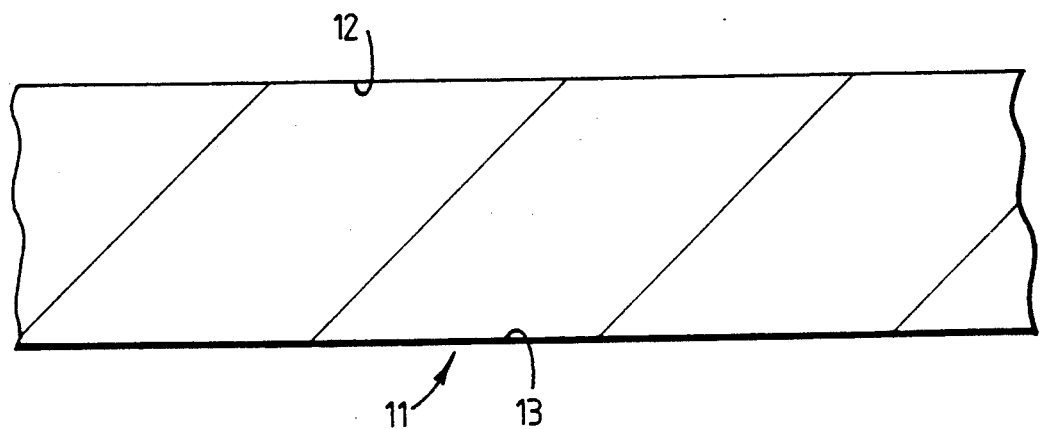
FIG. 5 is a cross-sectional view of part of a first semiconductor body for use in a method in accordance with the invention for manufacturing a semiconductor device.

In this example, where a square grid is adopted and the device to be manufactured is a static induction transistor (SIT) the grooves 418 may have a width W of about 10 μm and be spaced by a distance D of about 10 μm. Typically, where an isotropic etching process is used, the grooves 18 may have a maximum depth of about 5 μm.

the second semiconductor body 11 which is shown in FIG. 5 is, in this example, similar to the first semiconductor body and comprises a monocrystalline silicon body of the same conductivity type as the first semiconductor body 1 and having a similar resistivity. After definition of the electrically conductive pattern 20, the first major surfaces 2 and 12 of the first and second semiconductor bodies 1 and 11 are prepared for bonding.

In this example, a process known as 'slice-bonding' or 'slice wringing' is to be used to bond the first major surfaces 2 and 12. Thus, after conventional chemical cleaning, the first major surfaces 2 and 12 are polished to provide optically flat surfaces activated for bonding, that is to provide a surface roughness of less than 50 nm (nanometers) and preferably less than 5 nm. In this example, this 'mirror-polishing' is achieved by means of a chemomechanical polishing operation in which use is made, for example, of colloidal silicon dioxide in an alkaline solution with an oxidant such as, for example, the polishing agent marketed under the trade name of Syton 30 by Monsanto.

Figure 6:
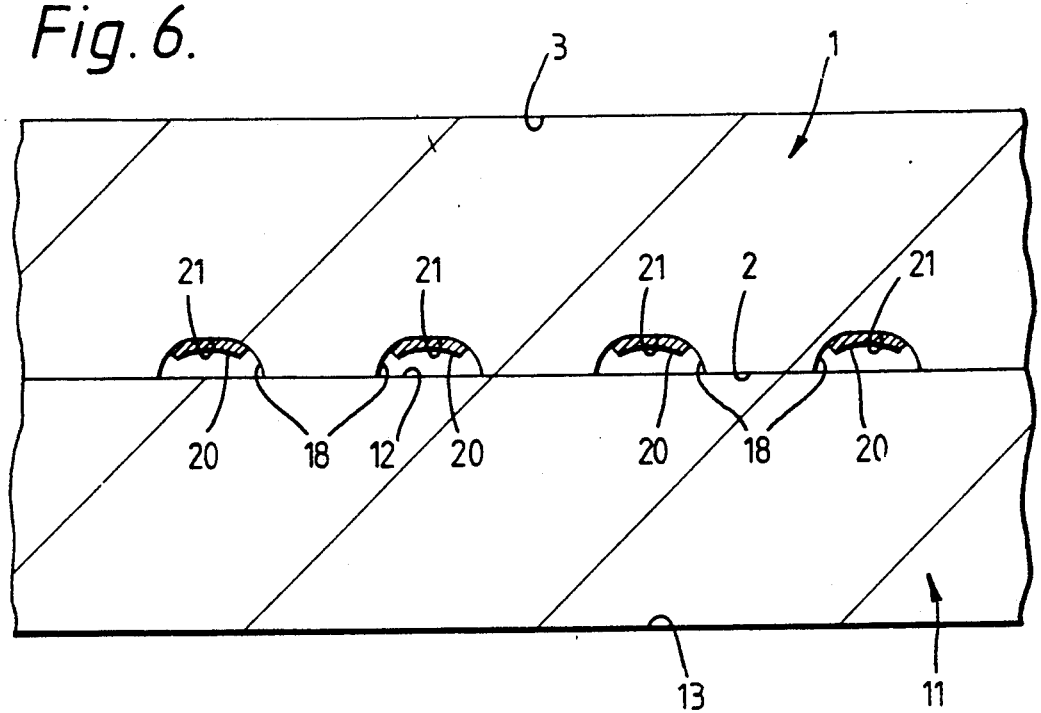
FIG. 6 is a cross-sectional view of the first and second semiconductor bodies bonded together.
Figure 7:
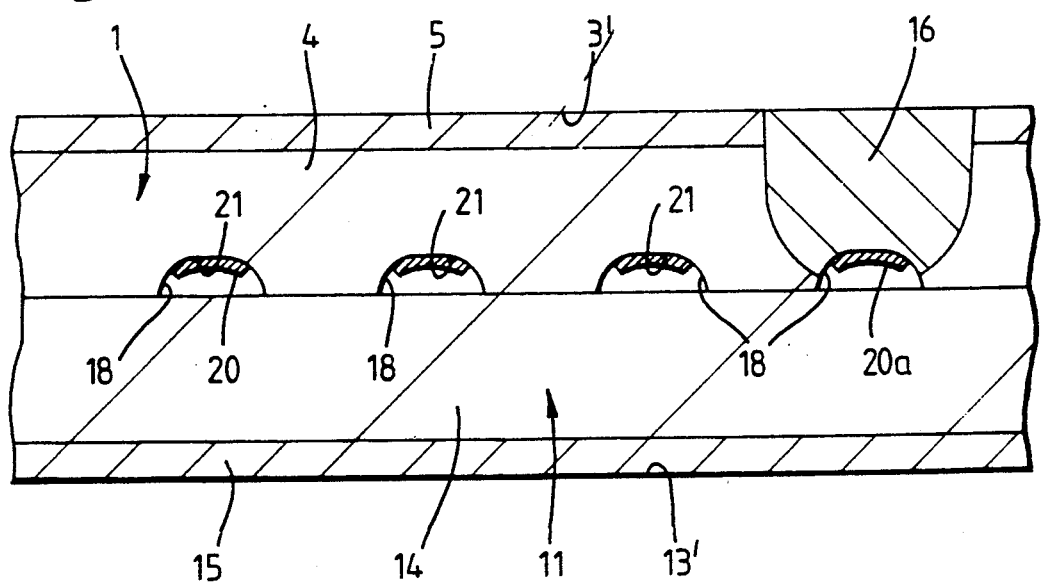
FIG. 7 is a cross-sectional view of the bonded first and second semiconductor bodies after further processing.

The first and second semiconductor bodies 1 and 11 are thus brought into contact with one another, without intentionally applying pressure, in a dust-free environment to establish bonding between the first major surfaces 2 and 12. It is believed that the bond formed between the first major surfaces 2 and 12 using this technique may be due to van der Waal's bonding or other dipole bonding and possibly enhanced bonding of a chemical or quantum mechanical nature between hydroxyl groups at the surfaces. The bond between the first and second semiconductor bodies 1 and 11 is then strengthened by an annealing process in which the semiconductor bodies 1 and 11 are subjected to a heat treatment. FIG. 6 shows the bonded first and second semiconductor bodies 1 and 11.

Generally, where the semiconductor bodies 1 and 11 are formed of silicon, then a heat treatment at a temperature of about 900 degrees Celsius for about 30 minutes will normally be required to provide sufficient strength for the bond between the first major surfaces 2 and 12 to be maintained although the use of lower temperatures may be possible. The temperature and duration of the heat treatment are, of course, selected so as to avoid causing any significant deterioriation of the Scottky junction 21. The maximum allowable temperature and duration will, of course, depend on the materials concerned. As an example if the electrically conductive material forming the Schottky junction 21 is a composite of layers of tungsten, titanium nitride and titanium silicide and the semiconductor bodies are formed of silicon then the heat treatment may be at a temperature of 900 degrees Celsius for 30 minutes.

In order to facilitate handling during bonding, the first and second semiconductor bodies 1 and 11 may be considerably thicker than is required for the final device. Accordingly, after bonding, the thicknesses of the first and second semiconductor bodies 1 and 11 may be reduced as shown schematically in FIG. 7 by conventional gridinging and polishing techniques to leave new second major surfaces 3' and 13'.

A highly doped contact region 16 of the opposite conductivity type, p conductivity type in this example, is formed to extend locally through the first semiconductor body 1 to an area 20a of the electrically conductive pattern 20 forming the Schottky junction 21. The contact region 16 forms an ohmic contact with the area 20a of the electrically conductive pattern. The contact region 16 may be formed by any suitable known technique, for example by locally introducing aluminium, which diffuses rapidly in silicon, as described in, for example, British Patent Application Number GB-A-1 536 545. Impurities of the one conductivity type, in this example n conductivity type, are introduced into the second major surfaces 3' and 13' to form highly doped layers 5 and 15 adjoining the remaining relatively lowly doped silicon regions 4 and 14.

The highly doped layers 5 and 15 serve merely to enable ohmic contact and accordingly if it is not desired to reduce the thickness of the semiconductor bodies 1 and 11 after bonding, then the highly doped layers 5 and 15 can be formed so as to be very thick so that the remaining lowly doped silicon regions 4 and 14 have a comparable thickness to that which would have resulted if the thickness of the first and second semiconductor bodies had been reduced by grinding and polishing.

After formation of the contact region 16 and the highly doped layers 5 and 15, an insulating layer, for example a layer of silicon dioxide, is deposited on the second major surface 3' and patterned to define insulating regions 19 leaving windows into which metallisation, for example aluminium, can be deposited to form a first main or drain electrode 30 contacting the highly doped substrate 5 and a gate electrode 31 for contacting the Schottky junction forming layer 20 via the highly doped contact region 16. Metallisation is also provided on the other second major surface 13' to provide a second main or source electrode 32.

Figure 8:
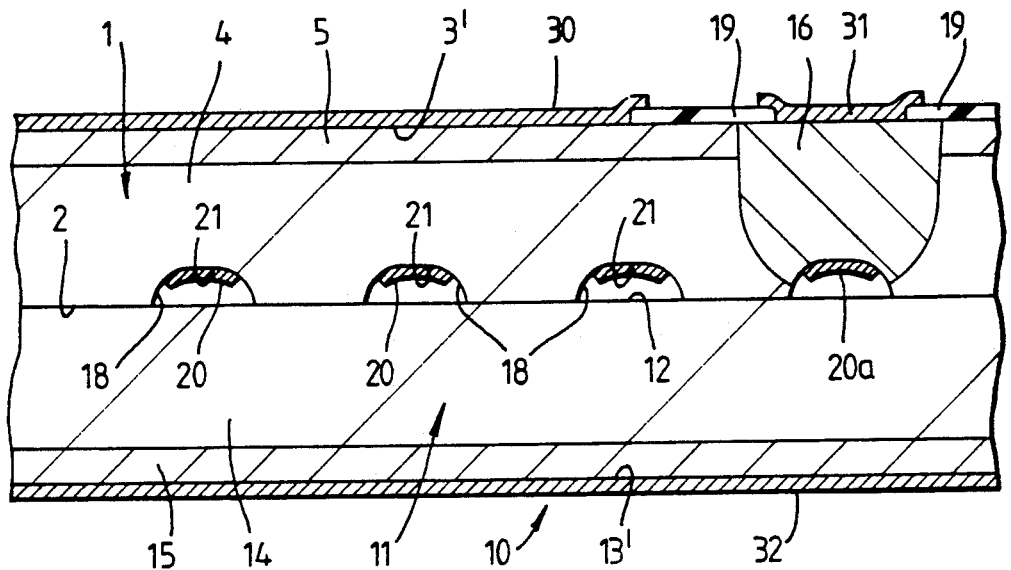
FIG. 8 is a cross-sectional view of a static induction transistor (SIT) manufactured using a method in accordance with the invention.

In operation of the device shown in FIG. 8, when a voltage is applied across the first and second main electrodes 30 and 32, the flow of current along the path defined by the electrically conductive pattern 20 of the Schottky junction 21 between the second major surfaces 3 and 13 is controlled by the voltage applied to the gate electrode 31 which regulates the depletion region associated with the Schottky junction 21. Because the material forming the Schottky junction 21 is highly electrically conductive and has a low resistance along its length, that is in the plane of the electrically conductive pattern 20, electrical contact to the electrically conductive pattern or gate 20 can be formed relatively easily, large gate voltages can be applied to the gate electrode 31 without causing breakdown between the source and drain electrodes 30 and 32.

Figure 9:
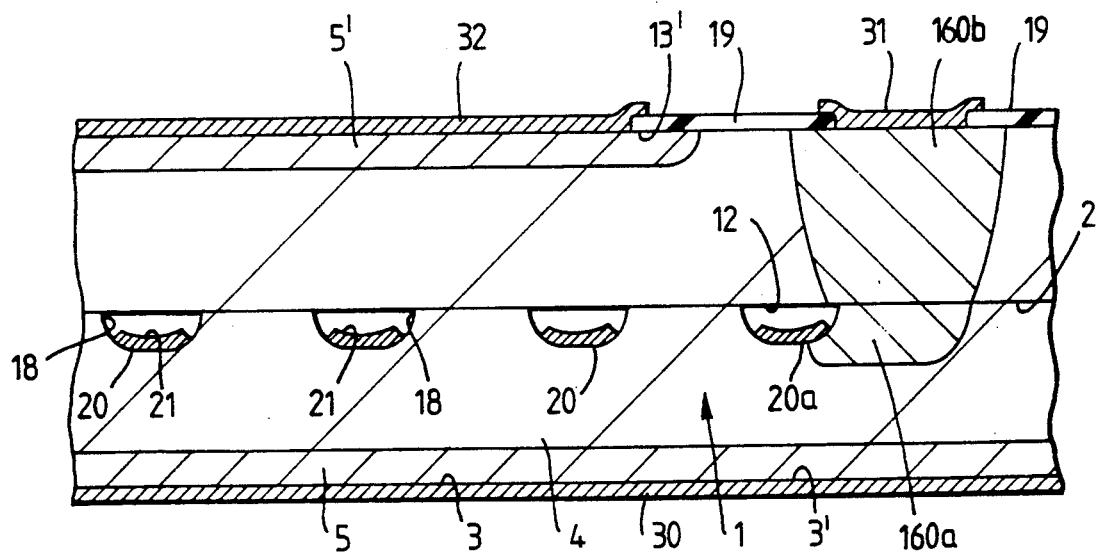
FIG. 9 is a cross-sectional view similar to FIG. 8 of a modified form of static induction transistor.

FIG. 9 is a cross-sectional view similar to FIG. 8 of a modified form of static induction transistor (SIT) manufactured using a method in accordance with the invention.

In this example, the electrically conductive pattern or gate layer 20 is contacted by a highly doped contact region, comprising first and second subsidiary regions 160a and 160b of the opposite conductivity type, which enables the gate electrode 31 to be on the same surface 13' as the high-voltage carrying source electrode 32 which should thus enable current cut-off to be achieved with lower gate voltages.

In order to form the structure shown in FIG. 9 the first highly doped subsidiary contact region 160a is formed using conventional masking and dopant introduction techniques at the surface 2 of the first semiconductor body 1 prior to the formation of the grooves 18 as shown in FIG. 1.

The impurities to form the highly doped layer 5' may be introduced through an appropriate mask in conventional manner so limiting the extent of the highly doped layer 5'. The highly doped second subsidiary contact region 160b is formed in a manner similar to the contact region 16 (shown in FIG. 8) but so as to contact the highly doped first subsidiary contact region 160a so that the electrically condeuctive pattern 20 is connected, as shown in FIG. 9, via the first and second subsidiary contact regions 160a and 160b to the gate electrode 31 which with the source and drain electrodes 30 and 32 is formed in conventional manner.

In the example described above, the semiconductor bodies 1 and 11 are monocrystalline bodies in which the relatively highly doped layers 5 and 15 are formed by introduction of impurities. It is however possible for the semiconductor bodies 1 and 11 to be formed by growing relatively lowly doped epitaxial material to form the regions 4 and 14 on relatively highly doped substrates 5 and 15 so that the highly doped layers 5 and 15 are always present in the semiconductor bodies 1 and 11. It is however difficult to grow epitaxial material which has as low a dopant concentration as can be achieved using monocrystalline material and so the reverse breakdown voltages which may be achieved would normally be lower if this approach is adopted.

Although in the example described above, the grooves 18 remain empty above the electrically conductive pattern 20, insulating material may for example be deposited after the electrically conductive pattern 20 to fill the grooves 18 and then etched back to expose the one first major surface 12.

In addition, it may be possible for the electrically conductive pattern 20 to be defined directly onto the one first major surface 12 without forming grooves therein so that the electrically conductive pattern forms a Schottky junction with both semiconductor bodies.

Although in the arrangement described above, the grid 20 is contacted by the deep diffused contact region 16, it may be possible to define a mesa structure in the second semiconductor body 11 to enable electrical contact to the grid 20.

The present invention may be applied to other devices. In particular, the two semiconductor bodies 1 and 11 need not be of similar conductivity but could be of opposite conductivity types and/or have different dopant concentrations. In addition, one or both of the more highly doped substrates 4 and 14 may be of the opposite conductivity type to the associated epitaxial layers 5 and 15.

Although the device described above is formed of silicon, other semiconductor materials, for example germanium or III-V materials could be used and the semiconductor bodies 1 and 11 could be of different semiconductor materials so that a heterojunction is formed at the interface between the first major surfaces 2 and 12.

From reading the present disclosure, other modifications will be apparent to persons skilled in the art. Such modifications may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising the steps of providing first and second semiconductor bodies having first and second major surfaces, defining a rectifying junction pattern adjacent to at least one of the first major surfaces and bonding the first major surfaces together to join the two semiconductor bodies to form a structure in which the rectifying junction pattern defines a path for the flow of charge carriers between the second major surfaces, characterized by defining the rectifying junction pattern by forming at the one first major surface an electrically conductive pattern forming a Schottky junction with at least one of the first and second semiconductor bodies, further characterized by defining the electrically conductive pattern by forming one or more grooves in the one first major surface and providing electrically conductive material in at least one of the grooves, further characterized by defining the electrically conductive pattern as an electrically conductive grid, and further characterized by providing the first and second semiconductor bodies of one conductivity type, and by providing electrical contact to the electrically conductive pattern by forming a highly doped region of the opposite conductivity type extending through one of the first and second semiconductor bodies to form an ohmic contact with the electrically conductive pattern.

2. A method according to claim 1, further characterised by providing each of the first and second semiconductor bodies as a relatively highly doped layer adjacent the second major surface and a relatively lowly doped layer of the same conductivity type adjacent the first major surface and providing electrically conductive contacts on the second major surfaces.

3. A method according to claim 1, further characterised by bonding the first major surfaces by mirror polishing the first major surfaces to form optically flat activated surfaces, bringing the polished surfaces into contact to establish bonding between the first major surfaces and subjecting the joined bodies to a heat treatment to strengthen the bond between the first major surfaces.

4. A method according to claim 1, further characterised by providing the first and second semiconductor bodies as silicon bodies and by forming the electrically conductive pattern by depositing a material selected from the group consisting of molybdenum silicide, tungsten silicide, titanium silicide, tungsten nitride, hafnium nitride and a composite comprising layers of tungsten, titanium nitride and titanium silicide.

5. A method of manufacturing a semiconductor device comprising the steps of providing first and second semiconductor bodies each having first and second major surfaces, defining a rectifying junction pattern adjacent to at least one of the first major surfaces, and bonding the first major surfaces together to join the two semiconductor bodies to form a structure in which the rectifying junction pattern defines a path for the flow of charge carriers between the second major surfaces, characterized by defining the rectifying junction pattern by forming at the one first major surface an electrically conductive pattern forming a Schottky junction with at least one of the first and second semiconductor bodies, further characterized by providing the first and second semiconductor bodies of one conductivity type and by providing electrical contact to the electrically conductive pattern by forming a highly doped region of the opposite conductivity type extending through one of the first and second semiconductor bodies to form an ohmic contact with the electrically conductive pattern.

* * * * *